(12) United States Patent
Ho et al.

(10) Patent No.: US 7,002,246 B2
(45) Date of Patent: Feb. 21, 2006

(54) CHIP PACKAGE STRUCTURE WITH DUAL HEAT SINKS

(75) Inventors: Ming-Lun Ho, Kaohsiung (TW); Yu-Wen Chen, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/710,344

(22) Filed: Jul. 2, 2004

(65) Prior Publication Data

US 2005/0001311 A1    Jan. 6, 2005

(30) Foreign Application Priority Data

Jul. 2, 2003    (TW) ................. 92118039 A

(51) Int. Cl.
*H01L 23/02*    (2006.01)
(52) U.S. Cl. .............. 257/707; 257/706; 257/678; 257/701

(58) Field of Classification Search ............. 257/276, 257/625, 675, 706, 707, 717, 718, 719, 720, 257/721, 722, 796; 361/704
See application file for complete search history.

(56) References Cited

U.S. PATENT DOCUMENTS 5,909,056 A * 6/1999 Mertol
2002/0171144 A1 * 11/2002 Zhang et al.
2003/0035269 A1 * 2/2003 Chiu

* cited by examiner

*Primary Examiner*—Nathan J. Flynn
*Assistant Examiner*—Kevin Quinto
(74) *Attorney, Agent, or Firm*—Jiang Chyun IP Office

(57) ABSTRACT

A chip package structure includes a substrate having an upper surface and a lower surface, a chip having an active surface and a back surface, a stiffener, a first heat sink and a second heat sink. The active surface of the chip is attached on the upper surface of the substrate via bumps, so that the chip electrically connects to the substrate. The stiffener is disposed on the upper surface of the substrate and around the chip. The first heat sink is disposed on the back surface of the chip and on the stiffener ring. The second heat sink is disposed on the lower surface of the substrate.

9 Claims, 3 Drawing Sheets

CHIP PACKAGE STRUCTURE WITH DUAL HEAT SINKS

CROSS REFERENCE TO RELATED APPLICATIONS

This application claims the priority benefit of Taiwan application serial no. 92118039, filed Jul. 2, 2003.

BACKGROUND OF INVENTION

1. Field of the Invention

This invention relates to a semiconductor chip package, and more particularly to a chip package structure with better heat dissipation and less warpage of the package substrate.

2. Brief Description of Related Art

In the semiconductor industry, the production of integrated circuits (ICs) includes three stages: wafer production, IC production and IC package. A bare chip (die) is obtained after forming a plurality of semiconductor devices on a wafer and singulating the wafer. The singulated bare chip is electrically connected to an external device via contacts and then encapsulated by the molding compound. The package structure of the chip can protect the bare chip from influences of external moisture, heat, and noise, and acts as a medium for electrically connecting the bare die and the external circuitry.

Flip chip bonding technology distributes bonding pads over an active surface of a chip in area arrays, and turns (flips) the chip upside down to attach onto a carrier after bumps has been formed respectively on the bonding pads. The bumps electrically and physically connect bonding pads of the chip to the contacts of the substrate so that chip is electrically connected to the substrate via the bumps and can be further connected to external devices through an inner wiring of the substrate.

It is noted the flip chip technology can be applied to high-pin-count semiconductor package structures. Moreover, because of its advantages such as small package area and short signal transmission path, flip chip technology has been widely applied in the semiconductor package. One of the most common flip-chip package structures is the flip chip ball grid array (FC/BGA) type package structure. As the operation speed of the chips keeps increasing, higher requirement of heat dissipation accordingly is desired.

FIG. 1 is a side view of a conventional FC/BGA chip package structure 100. Bumps 106 electrically connect a chip 102 and a substrate 104. In other words, bodning pads (not shown) on the chip 102 electrically connect to electrode pads (not shown) on the substrate 104 via the bumps 106. An underfill 108 is filled between the chip 102 and the substrate 104. The underfill 108 provides stress buffer to protect the bumps 106 between the chip 102 and the substrate 104 from damages due to mismatch in coefficients of thermal expansion (CTE). A stiffener ring 110 is disposed on the substrate 104 and around the chip 102. A heat sink 112 locates on the stiffener ring 110 and on the back side of the chip 102. Furthermore, solder balls 114 are further mounted on another surface of the substrate 104 opposite to the chip carrying surface of the substrate 104. The bonding pads of the chip 102 electrically connect to solder balls 114 via an internal wiring of the substrate 104.

However, for the chip package structure of FIG. 1, during thermal cycles or reliability tests of equipment that is installed with such package structure, the package structure tends to warp or deform, due to the CTE mismatch between the chip and the substrate (CTE of the chip is about 2.6 ppm/° C. and that of the substrate is about 15–18 ppm/° C.). Sometimes in serious cases, bumps in the package structure even detach from the substrate as shown in FIG. 2. Such a deformation becomes significant when the size of the chip becomes approximate to that of the substrate; for example, when the chip is 19*23 mm and the substrate is 27*27 mm.

SUMMARY OF INVENTION

Therefore, it is an object of the invention to provide a chip package structure which affords better heat dissipation of the chip.

It is another object of the invention is to provide a package structure in which the deformation or warpage of the substrate during thermal cycles can be alleviated.

In order to achieve the above and other objectives, the chip package structure of the invention at least includes a substrate having an upper surface and a lower surface, a chip having an active surface and a back surface, a first heat sink and a second heat sink and/or a stiffener. The active surface of the chip is attached to the upper surface via bumps, so that the chip electrically connects to the substrate. The stiffener is disposed on the upper surface of the substrate and around the chip. The first heat sink is disposed on the back surface of the chip and on the stiffener. The second heat sink is disposed on the lower surface of the substrate, below the chip.

As embodied and broadly described herein, the second heat sink may have a coefficient of thermal expansion similar to or the same as that of the substrate. Moreover, one or more fins can be further included on the second heat sink, which helps to increase the heat dissipation efficiency.

Furthermore, the stiffener can be integrally formed with the first heat sink as an integral single body.

As described above, the second heat sink attached onto the lower surface of the substrate increases the heat dissipation efficiency of the semiconductor package structure.

The stiffener firmly attached onto the lower surface of the substrate also reinforces the package structure and lessens the warpage deformation of the substrate.

As the second heat sink has a coefficient of thermal expansion similar to or the same as that of the substrate, the second heat sink can be considered as a structural reinforcement for the substrate to prevent warpage deformation.

DETAILED DESCRIPTION

Figure 1:
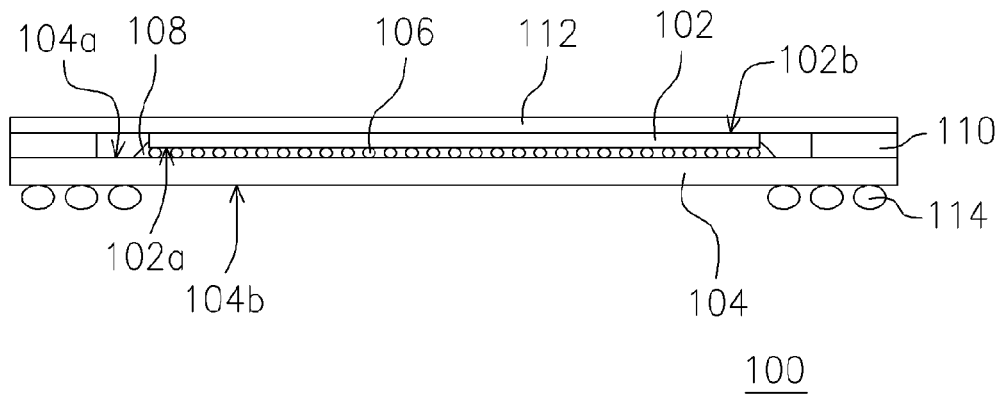
FIG. 1 is a side view of a conventional chip package structure.
Figure 2:
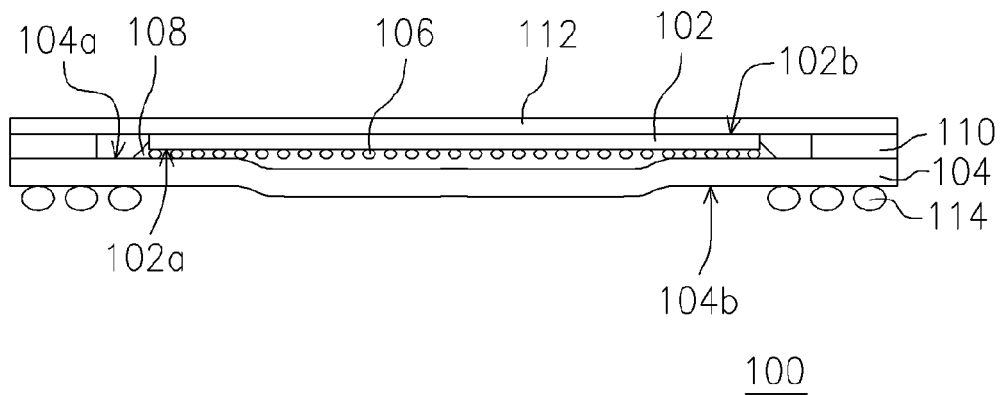
FIG. 2 is a side view of a conventional chip package of which a substrate is deformed in thermal cycles.
Figure 3:
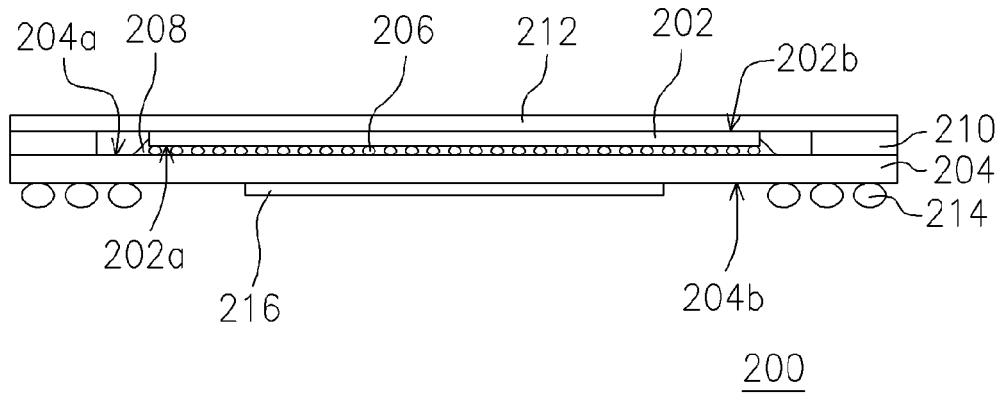
FIG. 3 is a side schematic view of a chip package structure according to one embodiment of the invention.

FIG. 3 is a side schematic view of a chip package structure according to one embodiment of the invention. Referring to FIG. 3, the flip-chip package structure 200 at least includes a chip 202, a substrate 204, a stiffener 210, a first heat sink 212 and a second heat sink 216.

The substrate 204 has an upper surface 204a and a lower surface 204b. The chip 202 has an active surface 202a and a back surface 202b. Bumps 206 electrically connect contact pads (not shown) on the active surface 202a of the chip 202 to electrode pads (not shown) on the upper surface 204a of the substrate 204.

The stiffener 210 is disposed on the upper surface 204a of the substrate 204 and surrounding the chip 202. The stiffener 210 can assist the positioning of the first heat sink 212 in the subsequent process and enlarges the heat dissipating area of the first heat sink 212 for better heat dissipation.

The first heat sink 212 is attached onto the back surface 202b of the chip 202 and to the stiffener 210. The first heat sink 202 can be made of a metal, for example, copper. The first heat sink 212 can be glued onto the back surface 202b of the chip 202 and to the stiffener 210, for example.

Figure 4:
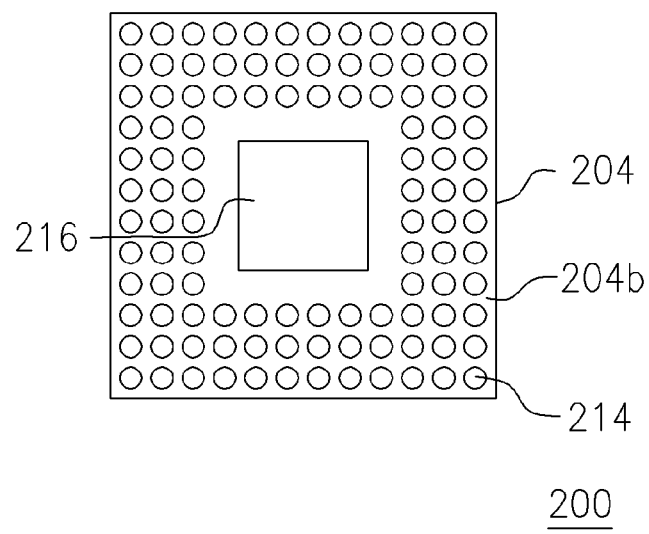
FIG. 4 is a bottom schematic view of a substrate of the chip package structure according to one embodiment of the invention.

The second heat sink 216 is disposed on the lower surface 204a of the substrate 202 and below the chip 202. The second heat sink 216 can be made of a metal, for example, copper. FIG. 4 illustrates the lower surface 204b of the substrate 204 of a chip package structure according to one embodiment of the invention. Referring to FIG. 4, a plurality of solder balls 214 are mounted on the lower surface 204b of the substrate 204. The second heat sink 216 locates on a central area of the lower surface 204b of the substrate 204 where no solder balls 214 are mounted thereon.

It is noted that the second heat sink 216 is firmly attached on the lower surface 204b of the substrate 204. Therefore, the second heat sink 216 not only enhances the heat dissipation but also alleviates the deformation of the substrate 204.

The material of the second heat sink 216 can be chosen to have a coefficient of thermal expansion (CTE) similar to or the same with that of the substrate 204. In one embodiment, the second heat sink 216 is made of the same material as the substrate 204. In this case, since the thermal expansions of the second heat sink 216 and the substrate 204 are similar or about the same, the second heat sink 216 attached onto the lower surface 204b of the substrate 204 can be considered as a strengthened integrally formed structure. Furthermore, an underfill material can be filled between the chip 202 and the substrate 204 to wraps the bumps, for reducing stress between the chip 202 and the substrate 204.

Figure 5:
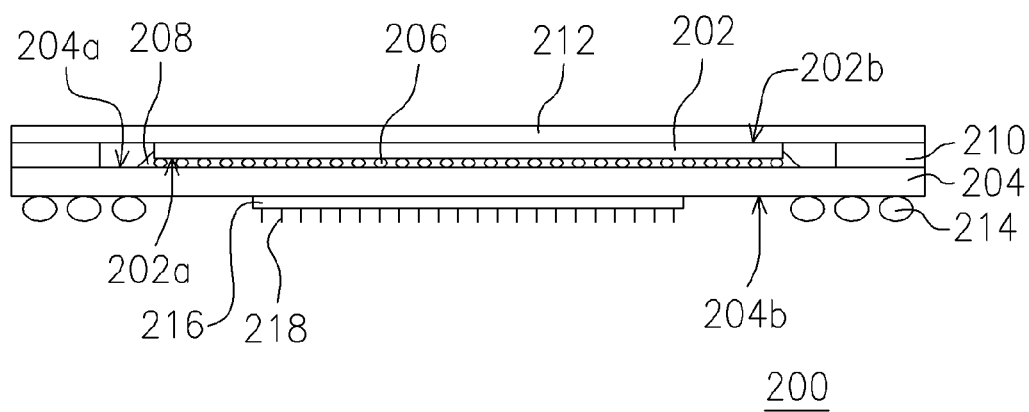
FIG. 5 is a side schematic view of a chip package structure according to another embodiment of the invention.

FIG. 5 is a side schematic view of a package structure according to another embodiment of the invention. The elements indicated by the same reference numeral in the above embodiment are the same as those in the above embodiment, and thus need not to describe in details hereafter.

In this embodiment, the second heat sink 216 is further provided with at least one fin 218 thereon. The fin 218 mounted on the second heat sink 216 enlarges the heat dissipating area of the second heat sink 216 and increases the heat dissipation of the chip 202. It is noted that the height of the fin 218 must be carefully chosen, for example, to be less than the height of the solder balls 214, for not impairing any contact between the solder balls 214 and other components.

In this embodiment, the second heat sink 216 can be, but not limited to, of rectangular shape. The shapes of the second heat sink 216 can be varied depending on the design requirements.

Figure 6:
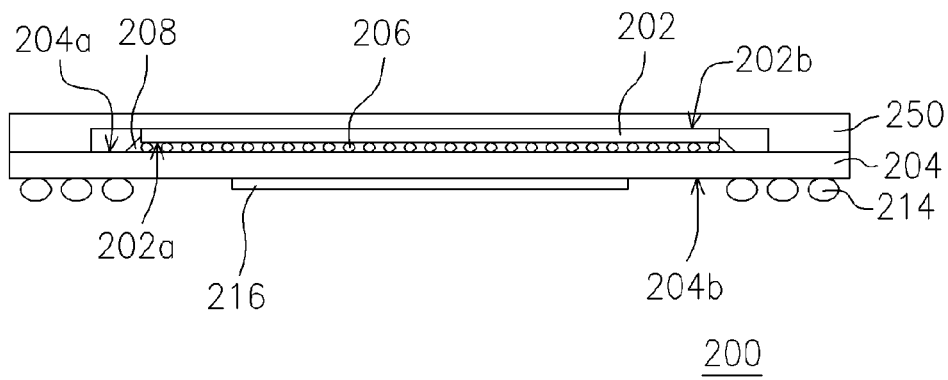
FIG. 6 is a side schematic view of a chip package structure according to another embodiment of the invention.
Figure 7:
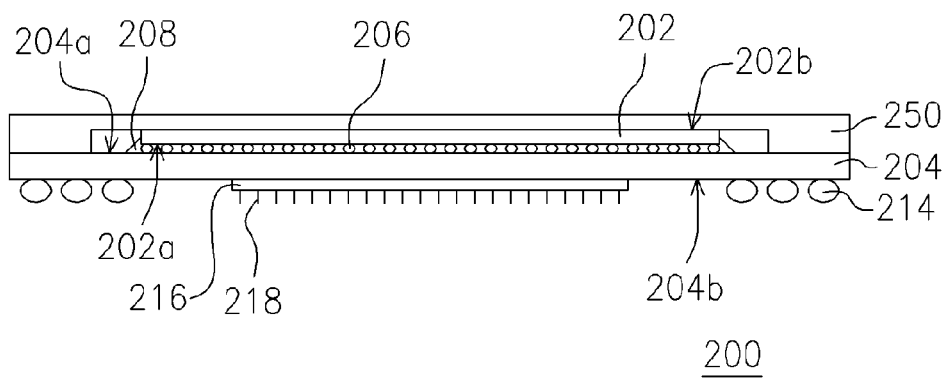
FIG. 7 is a side schematic view of a chip package structure according to another embodiment of the invention.

In the above embodiment, the stiffener 210 and the first heat sink 212 are separately mounted. However, they can be also integrally formed into a single body as shown in FIG. 6 and FIG. 7. The elements indicated by the same reference numeral in FIG. 6 and FIG. 7 are the same as those in the above embodiment, and thus need not to describe in details hereafter. Specifically, in FIGS. 6 and 7, the heat sink 250 is a single body with a stiffener integrally formed therein.

As described above, the invention provides the advantages as follows:

1. The heat sink mounted on the lower surface of the substrate in the package structure help to increase the heat dissipation efficiency of the chip.

2. The heat sink firmly mounted on the lower surface of the substrate in the package structure can lessen the warpage deformation of the substrate.

3. Since the heat sink attached on the lower surface of the substrate has a CTE similar to or the same as that of the substrate, the heat sink can reinforce the structural strength of the substrate to avoid the warpage deformation of the substrate.

Realizations in accordance with the present invention therefore have been described in the context of particular embodiments. These embodiments are meant to be illustrative and not limiting. Many variations, modifications, additions, and improvements are possible. Accordingly, plural instances may be provided for components described herein as a single instance. Additionally, structures and functionality presented as discrete components in the exemplary configurations may be implemented as a combined structure or component. These and other variations, modifications, additions, and improvements may fall within the scope of the invention as defined in the claims that follow.

What is claimed is:

1. A chip package structure, comprising:
   a substrate, having an upper surface and a lower surface;
   a chip, having an active surface and a back surface, wherein the active surface of the chip is mounted to the upper surface of the substrate, and the chip is electrically connected to the substrate;
   a stiffener, disposed on the upper surface of the substrate and around the chip;
   a first heat sink, disposed on the back surface of the chip and on the stiffener; and
   a second heat sink, disposed on the lower surface of the substrate and below the chip, wherein a coefficient of thermal expansion of the second heat sink is the same as that of the substrate.

2. The package structure of claim 1, wherein the second heat sink further includes at least one fin to increase the heat dissipation efficiency.

3. The package structure of claim 1, wherein a material of the first heat sink includes a metal.

4. The package structure of claim 1, wherein a material of the second heat sink includes a metal.

5. The package structure of claim 1, further comprising a plurality of solder balls, wherein the solder balls are disposed on the lower surface and around the second heat sink.

6. The package structure of claim 1, wherein the stiffener and the first heat sink are integrally formed as an integral single body.

7. The package structure of claim 1, wherein the lower surface of the substrate further has a central area and the second heat sink is attached to the central area.

8. The package structure of claim 1, further comprising a plurality of bumps through which the chip is mounted on the upper surface of the substrate and electrically connected to substrate.

9. The package structure of claim 8, further comprising an underfill material between the chip and the substrate.

* * * * *